United States Patent [19]

Pitel

[11] 4,027,270
[45] May 31, 1977

[54] CLASS ABC AMPLIFIER CIRCUIT

[75] Inventor: Ira Jay Pitel, Williamsport, Pa.

[73] Assignee: GTE Sylvania Incorporated, Stamford, Conn.

[22] Filed: Mar. 11, 1976

[21] Appl. No.: 666,026

[52] U.S. Cl. .................................. 330/15; 330/13; 330/18; 330/19; 330/22; 330/24
[51] Int. Cl.² ............................................ H03F 3/26
[58] Field of Search ................... 330/13, 15, 18, 19, 330/22, 24, 40

[56] References Cited

UNITED STATES PATENTS 3,622,899  11/1971  Eisenberg ....................... 330/15 X

*Primary Examiner*—James B. Mullins
*Attorney, Agent, or Firm*—Norman J. O'Malley; Thomas H. Buffton; Robert T. Orner

[57] ABSTRACT

A high efficiency linear amplifier which operates in a class AB mode so long as the output potential is less than a first potential source and switches to a second potential source and output electron device when the output potential exceeds the magnitude of the first potential source.

14 Claims, 4 Drawing Figures

CLASS ABC AMPLIFIER CIRCUIT

BACKGROUND OF THE INVENTION

As is well known, amplifiers are frequently classified in accordance with the mode of operation i.e. class A, B, C, and AB for example. Also, it is well known that the maximum theoretical efficiency of a class B amplifier is about 78.5% while class AB amplifiers with a performance intermediate class A and class B amplifiers frequently have a plate efficiency which is only in the range of about 35 to 50%. Thus, such systems are subject to relatively poor efficiency and large loss of power which is deleterious to apparatus and particularly transistor and heat sink costs.

OBJECTS AND SUMMARY OF THE INVENTION

An object of the present invention is to provide improved amplifier circuitry. Another object of the invention is to provide amplifier circuitry of enhanced efficiency. Still another object of the invention is to provide amplifier circuitry having a reduced power loss as compared with known forms of amplifier circuits. A further object of the invention is to provide an ABC amplifier circuit wherein transistor and heat sink costs are reduced.

These and other objects and advantages are achieved in one aspect of the invention by an ABC amplifier circuit having a diode and first and second transistor series coupling a first potential source and a potential output terminal with the first transistor connected to a signal source and the second transistor connected by an impedance to the junction of the diode and first transistor and a third transistor connecting a second potential source to the potential output terminal and coupled to the first and second transistors.

PREFERRED EMBODIMENT OF THE INVENTION

For a better understanding of the present invention, together with other and further objects, advantages and capabilities thereof, reference is made to the following disclosure and appended claims in conjunction with the accompanying drawings.

Figure 1:
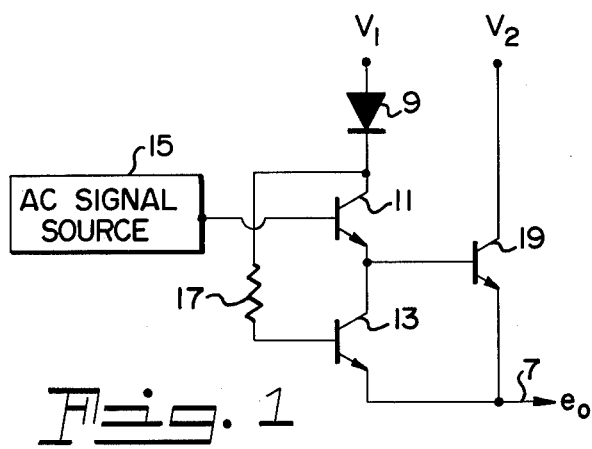
FIG. 1 illustrates a preferred embodiment of the invention.

Referring to FIG. 1 of the drawings, an ABC amplifier circuit includes a first potential source $V_1$. Series connecting the first potential source $V_1$ to a potential output terminal 7 is a diode 9, a first transistor 11 and a second transistor 13. The first transistor 11 has a base coupled to an AC signal source 15. The second transistor 13 has a base coupled by an impedance 17 to the junction of the series connected diode 9 and first transistor 11.

A third transistor 19 is coupled to a second potential source $V_2$ and to the potential output terminal 7. This third transistor 19 has a base connected to the junction of the series connected first and second transistors 11 and 13 respectively. Moreover, the second potential source $V_2$ provides an output potential of a magnitude greater than the potential provided by the first potential source $V_1$.

As to operation, the first potential source $V_1$, diode 9, and first and second transistors 11 and 13 operate in a class AB mode so long as the potential appearing at the potential output terminal 7 is of a magnitude less than the potential provided by the first potential source $V_1$. Under this condition, the second transistor 13 is turned on by way of current supplied from the first potential source $V_1$ via the impedance 17 to the second transistor 13. Moreover, conductivity of the second transistor 13 is accompanied by non-conductivity of the third transistor 19 whereupon no current is provided by the second potential source $V_2$.

However, when the potential appearing at the potential output terminal 7 is of a magnitude greater than the potential provided by the first potential source $V_1$, the second transistor 13 will be turned off and the diode 9 reverse biased. Thereupon, the third transistor 19 will be rendered conductive and current supplied to the output terminal 7 from the second potential source $V_2$ via the third transistor 19.

Thus, current is supplied to the output terminal 7 from the first potential source $V_1$ when the potential $e_o$ at the output terminal 7 is less than the potential of the first potential source $V_1$. Also, current is supplied to the output terminal 7 from the second potential source $V_2$ when the output potential $e_o$ is greater than the potential of the first potential source $V_1$. Since the power loss is proportional to the difference between the output potential $e_o$ and the potential source i.e. either $V_1$ or $V_2$, it can be seen that power losses are reduced by shifting from one potential source to the other as the output potential changes value.

Figure 2:
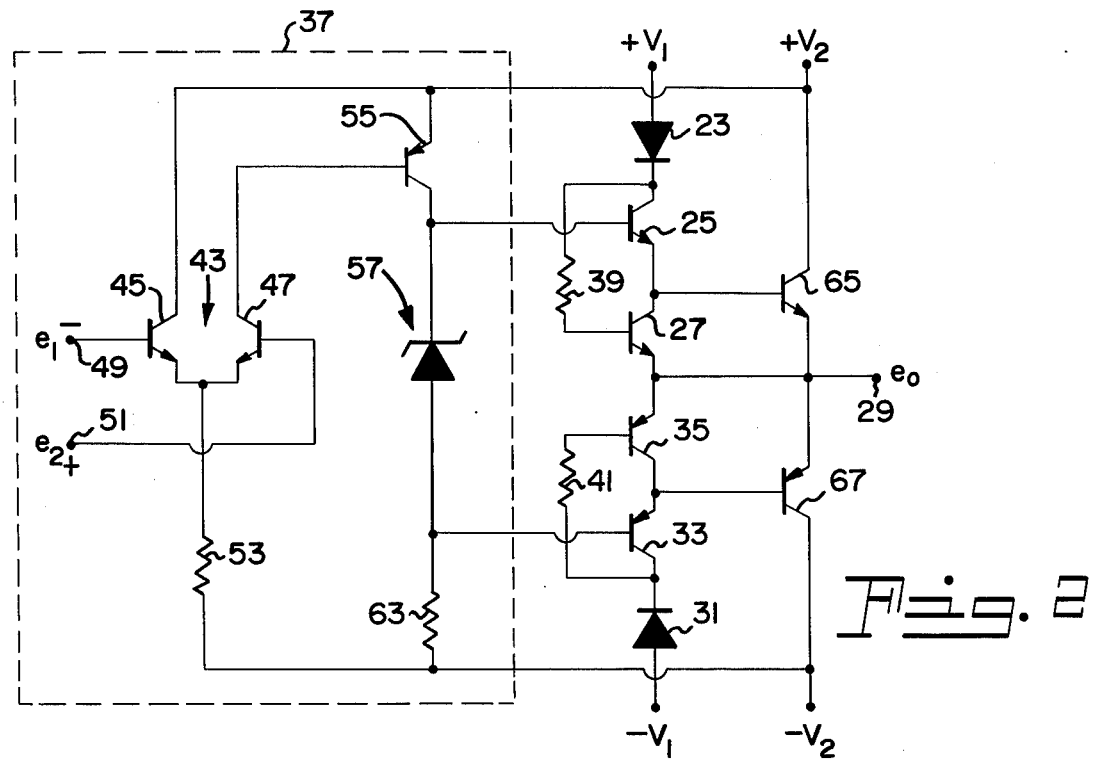
FIG. 2 is an alternate embodiment of a push-pull type of ABC amplifier circuit.

Further, FIG. 2 is a push-pull configuration of an ABC amplifier circuit such as detailed with respect to FIG. 1. Herein, a first potential source has first and second output potentials of opposite polarities, $+V_1$ and $-V_1$ respectively. A second potential source also has first and second output potentials of opposite polarity, $+V_2$ and $-V_2$ respectively. A series connected diode 23, first transistor 25 and second transistor 27 couple the first output potential $+V_1$ of the first potential source to an output terminal 29. Similarly, a series connected second diode 31, third transistor 33, and fourth transistor 35 couple the second output potential $-V_1$ of the first potential source to the output terminal 29.

The first transistor 25 and third transistor 33 each have a base electrode connected to a signal source 37. The second transistor 27 and fourth transistor 35 each have a base electrode connected by an impedance, 39 and 41 respectively, to the junction of the series connected diode and first and third transistors, 23 and 25 and 31 and 33.

The signal source 37 may be any one of a number of configurations for providing oppositely phased AC signals. In this instance, the signal source 37 includes a differential amplfier stage 43 having first and second transistor 45 and 47 each having a base electrode connected to oppositely phased signal terminals 49 and 51. The emitters of the first and second transistor 45 and 47 are connected by a resistor 53 to the second output potential 31 $V_2$ of the second potential source. The collector of the first transistor 45 is connected to the first potential output $+V_2$ of the second potential source. A series connected fifth transistor 55; third diode 57; and a resistor 63 are coupled intermediate the first and second opposite polarity output potentials $+V_2$ and $-V_2$ of the second potential source. The base of the fifth transistor 55 is coupled to the collector of the second transistor 47 of the differential amplifier stage 43. The junction of the fifth transistor 55 and third diode 57 is connected to the base of the first transistor 25 and the junction of the third diode 57 and resistor 63 is connected to the base of the third transistor 33.

A sixth transistor 65 and a seventh transistor 67 are coupled intermediate the first and second output potentials $+V_2$ and $-V_2$ respectively of the second potential source and the output terminal 29. The base of the sixth transistor 65 is connected to the junction of the first and second transistor 25 and 27 while the base of the seventh transistor 67 is connected to the junction of the third and fourth transistors 33 and 35.

Operation of the above-described embodiment is similar to the previous description of the embodiment of FIG. 1. Specifically, the first potential sources $+V_1$ and $-V_1$ in conjunction with the series connected first diode 23, first and second transistor 25 and 27 and the second diode 31 and third and fourth transistors 33 and 35 act as a class AB amplifier so long as the potential at the output terminal 29 is less than the potential provided by the first potential source $+V_1$ and $-V_1$.

The second transistor 27 and the fourth transistor 35 are turned on by way of a current supplied from the first and second potential sources $+V_1$ and $-V_1$ via the impedances 39 and 41 respectively. The sixth and seventh transistors 65 and 67 are rendered non-conductive and the second potential source $V_2$ provides no current to the output terminal 29.

When the potential appearing at the output terminal 29 exceeds the absolute potential of the first potential source $V_1$, the second and fourth transistors 27 and 35 will be turned off and the first and second diodes 23 and 31 reverse biased. However, the sixth and seventh transistors 65 and 67 will be rendered conductive and current will be supplied to the output terminal 29 from the first and second output potentials $+V_2$ and $-V_2$ of the second potential source.

As previously mentioned with respect to the embodiment of FIG. 1, the power loss is proportional to the difference between the potential at the output terminal and the source. Assume that the first potential source $V_1$ is lower than the second potential source $V_2$. The potential difference between the first potential source $V_1$ and the output terminal will be less than the potential difference between the second potential source $V_2$ and the output terminal so long as the output potential is less then $V_1$. When the output potential increases above $V_1$, a higher potential source is required (second potential source $V_2$) but the potential difference and power loss will be less than that of a single potential source system, class AB or class B.

Figure 3:
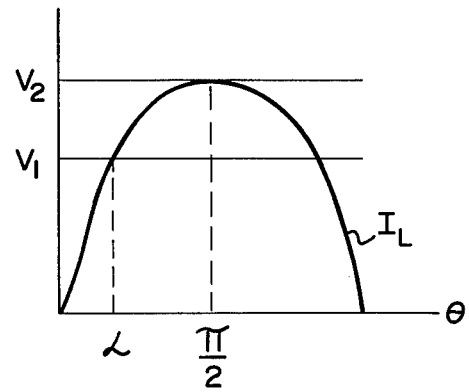
FIG. 3 is a graph utilized to illustrate the efficiency calculations of the circuitry of FIG. 1.
Figure 4:
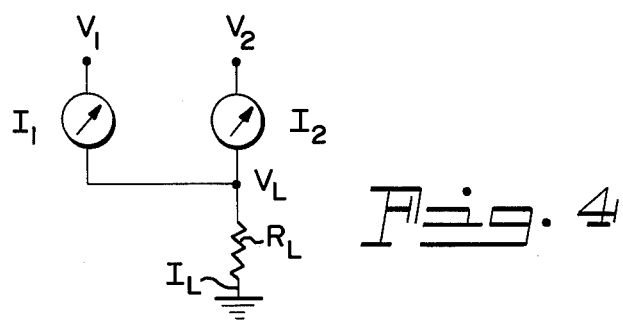
FIG. 4 is a diagrammatic circuit illustration utilized in conjunction with FIG. 3 to illustrate the basis for the efficiency calculations.

Additionally, the graph of FIG. 3 in conjunction with the diagrammatic circuit illustration of FIG. 4 may be utilized to explain the enhanced efficiency of the ABC amplifier circuit as compared with known theoretical maximum efficiency of 78.5% of a class B amplifier for example.

Assuming:

$I_1 = I_L$ if $0 < V_L < V_1$ $I_2 = I_L$ if $V_1 < V_L < V_2$ where $I_L$ and $V_L$ are peak values.

Calculating output and input power:

$$P \text{ out} = V_L(\text{rms}) \, I_L(\text{rms}) = \frac{V_L I_L}{2}$$

$$P \text{ in} = \frac{1}{T} \int_0^T ivdt$$

$$P \text{ in} = \frac{2}{\pi} \left[ \int_0^\alpha I_L \sin\Theta V_1 \, d\Theta + \int_\alpha^{\frac{\pi}{2}} I_L \sin\Theta V_2 \, d\Theta \right]$$

$$P \text{ in} = \frac{2}{\pi} I_L V_2 \left[ \int_0^\alpha \sin\Theta \sin\alpha \, d\Theta + \int_\alpha^{\frac{\pi}{2}} \sin\Theta \, d\Theta \right]$$

$$P \text{ in} = \frac{2}{\pi} I_L V_2 \left[ -\cos\Theta \sin\alpha \, \Big/_0^\alpha - \cos\Theta \, \Big/_\alpha^{\frac{\pi}{2}} \right]$$

$$P \text{ in} = \frac{2}{\pi} I_L V_2 \left[ -\cos\alpha \sin\alpha + \sin\alpha + \cos\alpha \right]$$

Calculating Efficiency:
For maximum power output, let $V_2 = V_L$ $$\text{Efficiency} = \frac{P \text{ out}}{P \text{ in}}$$

$$= \frac{V_L I_L}{2} \cdot \frac{1}{\frac{2}{\pi} I_L V_L [-\cos\alpha \sin\alpha + \sin\alpha + \cos\alpha]}$$

$$= \frac{\pi}{4} \cdot \frac{1}{\sin\alpha + \cos\alpha - \cos\alpha \sin\alpha}$$

Solving for Minimum Power in:

$$\frac{dP \text{ in}}{d\alpha} = \frac{2}{\pi} I_L V_L [\sin^2\alpha - \cos^2\alpha + \cos\alpha - \sin\alpha] = 0$$

$$\cos^2\alpha + \sin\alpha = \sin^2\alpha + \cos\alpha$$

Solving for $\alpha$:

$$\cos(\pi/4) = \sin(\pi/4)$$

$$\alpha = \pi/4$$

$$V_1 = V_2 \sin\frac{\pi}{4} = \frac{\sqrt{2}}{2} V_2$$

Solving for maximum efficiency:

$$\text{Efficiency} = \frac{\pi}{4} \cdot \frac{1}{\sin\alpha + \cos\alpha - \cos\alpha \sin\alpha}$$

let $\alpha = \frac{\pi}{4}$ $$\text{Efficiency Max.} = \frac{\pi}{4} \cdot \frac{1}{\frac{1}{\sqrt{2}} + \frac{1}{\sqrt{2}} - \frac{1}{2}}$$

$$= \frac{\pi}{4} \cdot \frac{1}{1.4/4 - .5}$$

$$\text{Efficiency Max.} = \frac{\pi}{4} \cdot \frac{1}{0.914} = 86\%$$

Thus, there has been provided a unique amplifier circuit having enhanced efficiency as compared with other known forms of amplifier circuitry. Moreover, the improved efficiency of the apparatus reduces undesired heat loss and thereby reduces output transistor and heat sink costs.

While there has been shown and described what is at present considered the preferred embodiments of the invention, it will be obvious to those skilled in the art that various changes and modifications may be made therein without departing from the invention as defined by the appended claims.

What is claimed is:

1. A class ABC amplifier circuit comprising:
   first and second potential sources and a potential output terminal;
   a signal source;
   a diode, first and second transistors series connecting said firt potential source and said potential output terminal with said first transistor having an input electrode coupled to said signal source and said second transistor having an input electrode coupled by an impedance to the junction of said series connected diode and first transistor; and
   a third transistor coupled to said second potential source and to said potential output terminal and having an input electrode coupled to the junction of said series connected first and second transistors, said third transistor being connected in a parallel-like configuration with said series connected diode, first and second transistors whereby a potential at said output terminal of a value less than the potential value of said first potential source effects conductivity from said first potential source by way of said series connected diode, first and second transistors and non-conductivity from said second potential source to said output terminal and a potential at said output terminal of a value greater than the potential value of said first potential source effects non-conductivity from said first potential source and conductivity from said second potential source by way of said third transistor to said output terminal.

2. The class ABC amplifier of claim 1 wherein said second potential source provides a potential of a magnitude greater than the potential provided by said first potential source.

3. The class ABC amplifier of claim 1 wherein said first transistor includes a collector connected to said diode, a base connected to said signal source, and an emitter connected to said second and third transistors.

4. The class ABC amplifier of claim 1 wherein said second transistor includes a collector connected to said first and third transistors, a base coupled by said impedance to said diode and first transistor, and an emitter connected to said potential output terminal.

5. The class ABC amplifier of claim 1 wherein said third transistor includes a collector connected to said second potential source, a base coupled to said first and second transistors, and an emitter connected to said potential output terminal.

6. The class ABC amplifier of claim 1 wherein said impedance coupling said second transistor to the junction of said diode and first transistor is in the form of a resistor.

7. The class ABC amplifier of claim 1 wherein said first and second transistor operates as a class AB amplifier when the potential at said output terminal is less than the potential of said first potential source.

8. The class ABC amplifier of claim 1 wherein the calculated maximum efficiency of said amplifier is about 86 percent.

9. The class ABC amplifier of claim 1 wherein a potential at said output terminal of a magnitude greater than the potential from said first potential source causes said second transistor to turn off, reverse biasing of said diode, and current supplied to said output terminal from said second potential source by way of said third transistor.

10. A class ABC amplifier circuit comprising:
    a first potential source having first and second output potentials of opposite polarity;
    a second potential source having first and second output potentials of opposite polarity;
    an AC signal source;
    an output potential terminal;
    a first diode and first and second transistor series coupling said first output potential of said first potential source to said output potential terminal;
    a second diode and third and fourth transistors series coupling said second output potential of said first potential source to said output potential terminal;
    means for coupling said first and third transistors to said AC signal source;
    impedance means coupling said second transistor to a junction of said first diode and first transistor and said fourth transistor to a junction of said second diode and third transistor;
    a fifth transistor connecting a first output potential of said second potential source to said output potential terminal and coupled to the junction of said first and second transistors; and
    a sixth transistor connecting a second output potential of said second potential source to said output potential terminal and coupled to the junction of said third and fourth transistors.

11. The class ABC amplifier circuit of claim 10 wherein said second potential source is of a magnitude greater than said first potential source.

12. The class ABC amplifier circuit of claim 10 wherein said impedance coupling said second transistor to said junction of said diode and first transistor is in the form of a resistor.

13. The class ABC amplifier circuit of claim 10 wherein said first and second transistors connected to said first output potential of said first potential source operate in a class AB mode when the potential at said output terminal is of a magnitude less than the magnitude of said first potential source.

14. The class ABC amplifier circuit of claim 10 wherein said output potential at said output terminal is derived from said second potential source by way of said fifth and sixth transistors when said output potential is greater than the potential of said first potential source.

* * * * *

UNITED STATES PATENT AND TRADEMARK OFFICE
CERTIFICATE OF CORRECTION

PATENT NO. : 4,027,270
DATED : May 31, 1977
INVENTOR(S) : Ira Jay Pitel

It is certified that error appears in the above-identified patent and that said Letters Patent are hereby corrected as shown below:

Col. 2 - Line 65 - after potential please delete "31 $V_2$" and insert $-V_2$

Col. 4 - Line 5 - after the equal sign please delete "$\frac{V_L V_L}{2}$" and insert $\frac{V_L I_L}{2}$ Col. 5 - Line 11 - please delete "firt" and insert --first--

Signed and Sealed this

Twentieth Day of September 1977

[SEAL]

Attest:

RUTH C. MASON
*Attesting Officer*

LUTRELLE F. PARKER
*Acting Commissioner of Patents and Trademarks*